(12) United States Patent
Lim et al.

(10) Patent No.: US 10,950,680 B2
(45) Date of Patent: Mar. 16, 2021

(54) LIGHT-EMITTING DISPLAY DEVICE AND METHOD OF MANUFACTURING THE SAME

(71) Applicant: LG Display Co., Ltd., Seoul (KR)

(72) Inventors: Dong-Hyeok Lim, Paju-si (KR); Song-Yi Jeong, Seoul (KR); Kyu-Il Han, Paju-si (KR); Nam-Seok Yoo, Seoul (KR); Yu-Ri Park, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 41 days.

(21) Appl. No.: 16/453,420

(22) Filed: Jun. 26, 2019

(65) Prior Publication Data
US 2020/0006458 A1    Jan. 2, 2020

(30) Foreign Application Priority Data
Jun. 27, 2018   (KR) .......................... 10-2018-0074365

(51) Int. Cl.
| H01L 27/32 | (2006.01) |
| H01L 51/00 | (2006.01) |
| H01L 29/08 | (2006.01) |
| H01L 35/24 | (2006.01) |

(52) U.S. Cl.
CPC ...... *H01L 27/3276* (2013.01); *H01L 27/3211* (2013.01); *H01L 27/3246* (2013.01); *H01L 27/3248* (2013.01)

(58) Field of Classification Search
CPC combination set(s) only.
See application file for complete search history.

(56) References Cited

U.S. PATENT DOCUMENTS

| 2004/0108808 | A1  | 6/2004  | Kumagai et al. |
| 2005/0067953 | A1* | 3/2005  | Yamazaki ........... H01L 27/3258 313/506 |
| 2006/0238111 | A1  | 10/2006 | Shimizu et al. |
| 2014/0175469 | A1  | 6/2014  | Dozen et al. |
| 2014/0217372 | A1  | 8/2014  | Shim et al. |
| 2014/0367669 | A1* | 12/2014 | Takeuchi ................ H01L 51/56 257/40 |
| 2015/0060826 | A1* | 3/2015  | Matsumoto ......... H01L 27/3246 257/40 |

(Continued)

FOREIGN PATENT DOCUMENTS

JP          2015-053215 A       3/2015

OTHER PUBLICATIONS

Extended European Search Report dated Dec. 4, 2019 issued in a counterpart European patent application No. EP 19 18 3049.6. (9 pages).

*Primary Examiner* — Nduka E Ojeh
(74) *Attorney, Agent, or Firm* — Polsinelli PC

(57) ABSTRACT

A light-emitting display device includes a substrate having a plurality of subpixels; a first electrode provided in each of the subpixels; a bank defining an emission part in each of the subpixels and having an upper surface that has a larger degree of surface roughness than an upper surface of the first electrode; a first common layer over the subpixels and covering the first electrode and the bank; a light-emitting layer on the first common layer and corresponding to the emission part of each of the subpixels; and a second common layer and a second electrode stacked on the light-emitting layer over the plurality of subpixels.

20 Claims, 12 Drawing Sheets

(56) References Cited

U.S. PATENT DOCUMENTS

| | | | |
|---|---|---|---|
| 2015/0069361 A1* | 3/2015 | Sato | H01L 27/3279 257/40 |
| 2016/0021718 A1* | 1/2016 | Kikuchi | H05B 33/22 362/231 |
| 2016/0155784 A1* | 6/2016 | Park | H01L 27/3246 257/88 |
| 2016/0190521 A1 | 6/2016 | Lee et al. | |
| 2017/0133357 A1* | 5/2017 | Kuo | H01L 25/0753 |
| 2018/0190724 A1* | 7/2018 | Kang | G06F 3/0443 |
| 2019/0103442 A1* | 4/2019 | Choi | H01L 51/5221 |
| 2020/0075699 A1* | 3/2020 | Kim | H01L 27/3246 |

* cited by examiner

LIGHT-EMITTING DISPLAY DEVICE AND METHOD OF MANUFACTURING THE SAME

CROSS-REFERENCE TO RELATED APPLICATION

This application claims the benefit of Korean Patent Application No. 10-2018-0074365, filed on Jun. 27, 2018, which is hereby incorporated by reference in its entirety.

BACKGROUND

Field of the Disclosure

The present disclosure relates to a display device, and more particularly to a light-emitting display device that can prevent current leakage in a structure in which common layers are commonly stacked in subpixels and a method of manufacturing the light-emitting display device.

Discussion of the Background

Recently, with the advent of the information age, the field of displays for visually displaying electrically conveyed information signals has rapidly developed. In response thereto, various kinds of flat panel display devices having excellent characteristics, such as a small thickness, a low weight, and low power consumption, have been developed, and have almost replaced all existing cathode ray tubes (CRTs).

Representative examples of such flat panel display devices may include a liquid crystal display (LCD) device, a plasma display panel (PDP) device, a field emission display (FED) device, an organic light-emitting display (OLED) device, and a quantum dot display device.

Among these, a self-illuminating display device, such as an organic light-emitting display device and a quantum dot display device, is considered as a competitive application because it does not require a separate light source and enables the realization of a compact device design and vivid color display.

Such a self-illuminating display device is configured such that a light-emitting layer is disposed in subpixels provided on a substrate and such that common layers are disposed under and above the light-emitting layer in order to increase light emission from the light-emitting layer. However, because the common layers are provided in common in the subpixels, when the subpixels are driven to emit light in the vertical direction, current may leak laterally to common layers of neighboring subpixels. Thus, even when only one specific subpixel is driven, neighboring subpixels may emit a small amount of light due to e current leakage, which results in deterioration in color display.

SUMMARY

Accordingly, the present disclosure is directed to a light-emitting display device and a method of manufacturing the same that substantially obviate one or more problems due to limitations and disadvantages of the related art.

The present disclosure is to provide a light-emitting display device that may prevent current leakage in a structure in which common layers are commonly stacked in subpixels and a method of manufacturing the light-emitting display device.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

A light-emitting display device and a method of manufacturing the same according to the present disclosure may prevent current leakage between adjacent subpixels by modifying the structure between emission parts and consequently may prevent unintended light emission due to current leakage.

To achieve these and other advantages and in accordance with the purpose of the disclosure, as embodied and broadly described herein, a light-emitting display device includes a substrate having a plurality of subpixels, a first electrode provided in each of the subpixels, a bank defining an emission part in each of the subpixels and having an upper surface that has a larger degree of surface roughness than the upper surface of the first electrode, a first common layer over the subpixels to cover the first electrode and the bank, a light-emitting layer disposed on the first common layer to correspond to the emission part of each of the subpixels, and a second common layer and a second electrode stacked on the light-emitting layer over the subpixels.

The light-emitting display device may further include a roughness-inducing layer between the first electrode of one of the subpixels and the first electrode of an adjacent one of the subpixels, under the bank.

The surface roughness of the bank may be determined depending on the surface roughness of the roughness-inducing layer.

The upper surface of the bank may be plasma-treated.

The roughness-inducing layer may be a silicon oxide film.

The light-emitting display device may further include a silicon nitride film under the roughness-inducing layer and the first electrode.

The light-emitting layer may extend to a region on the bank.

The first common layer may include at least one layer of a hole injection layer, a hole transport layer, and an electron-blocking layer, and the second common layer may include at least and layer of a hole-blocking layer, an electron transport layer, or an electron injection layer.

The area in which each of the first common layer and the second common layer overlaps the substrate may be larger than the area in which the light-emitting layer overlaps the substrate.

The roughness-inducing layer may have a thickness of 1000 Å or more, and the thickness of the roughness-inducing layer may be less than the thickness of the bank.

In accordance with another aspect of the present disclosure, a method of manufacturing a light-emitting display device includes preparing a substrate having a plurality of subpixels, providing a first electrode in each of the subpixels, providing a bank defining an emission part in each of the subpixels, the bank to define an emission part in each of the subpixels, wherein the bank has an upper surface that has a larger degree of surface roughness than an upper surface of the first electrode, providing a first common layer over the subpixels to cover the first electrode and the bank, providing a light-emitting layer on the first common layer to correspond to the emission part of each of the subpixels, providing a second common layer on the light-emitting layer over the subpixels, and providing a second electrode on the second common layer.

The method may further include, between the providing the first electrode and the providing the bank, providing a roughness-inducing layer between the first electrode of one of the subpixels and the first electrode of an adjacent one of the subpixels.

The method may further include, after the providing the bank, performing plasma treatment on the upper surface of the bank.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate aspect(s) of the disclosure and together with the description serve to explain the principle of the disclosure.

In the drawings.

DETAILED DESCRIPTION

Figure 1:
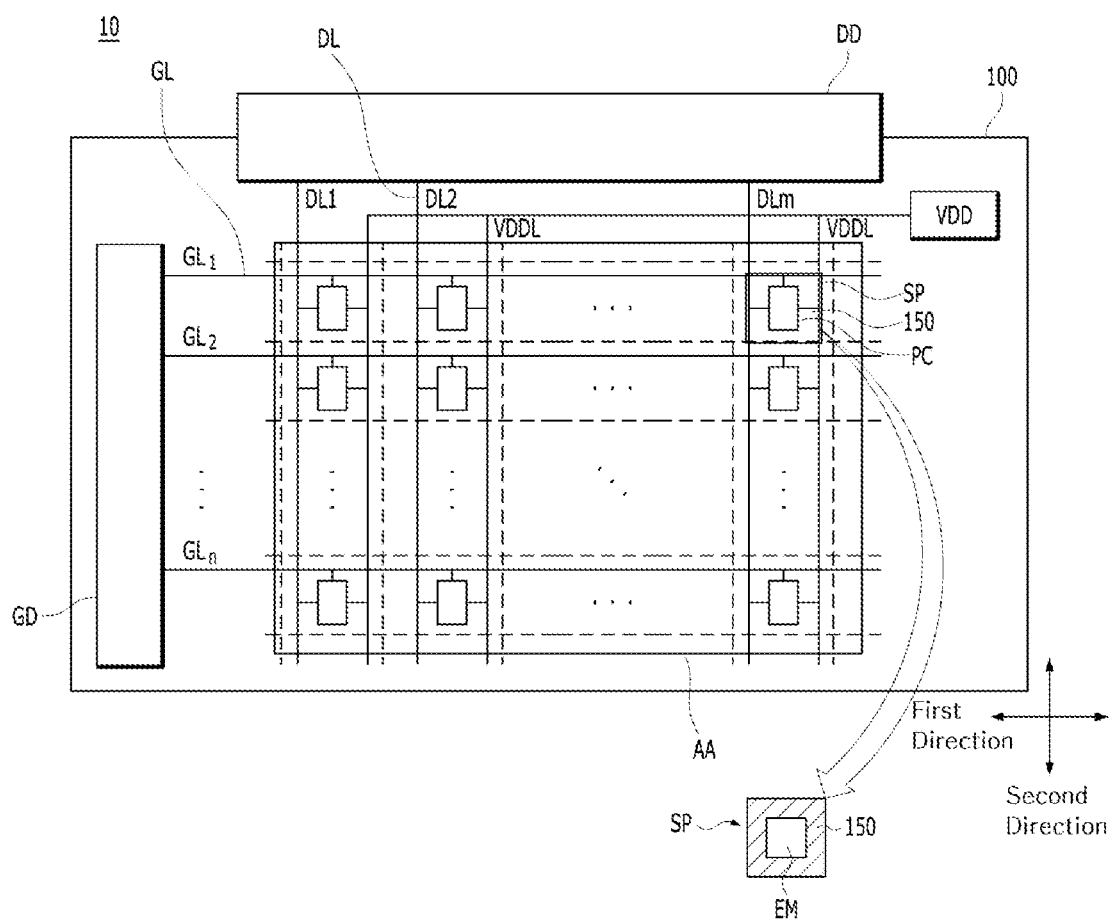
FIG. 1 is a plan view illustrating a light-emitting display device according to the present disclosure.

Reference will now be made in detail to the aspects of the present disclosure, examples of which are illustrated in the accompanying drawings. The same reference numerals used throughout the specification refer to the same or like parts. In the following description of the present disclosure, a detailed description of known functions and configurations incorporated herein will be omitted when it may make the subject matter of the present disclosure rather unclear. Names of components used in the following description are selected in consideration of facility of specification preparation. Thus, the names of the components may be different from names of components used in a real product.

In the drawings for explaining the exemplary aspects of the present disclosure, for example, the illustrated shape, size, ratio, angle, and number are given by way of example, and thus are not limited to the disclosure of the present disclosure. Throughout the present specification, the same reference numerals designate the same constituent elements. In addition, in the following description of the present disclosure, a detailed description of known functions and configurations incorporated herein will be omitted when it may make the subject matter of the present disclosure rather unclear. The terms "comprises", "includes", and/or "has", used in this specification, do not preclude the presence or addition of other elements unless used along with the term "only". The singular forms are intended to include the plural forms as well, unless the context clearly indicates otherwise.

In the interpretation of constituent elements included in the various aspects of the present disclosure, the constituent elements are interpreted as including an error range even if there is no explicit description thereof.

In the description of the various aspects of the present disclosure, when describing positional relationships, for example, when the positional relationship between two parts is described using "on", "above", "below", "next to", or the like, one or more other parts may be located between the two parts unless the term "directly" or "closely" is used.

In the description of the various aspects of the present disclosure, when describing temporal relationships, for example, when the temporal relationship between two actions is described using "after", "subsequently", "next", "before", or the like, the actions may not occur in succession unless the term "directly" or "just" is used therewith.

In the description of the various aspects of the present disclosure, although terms such as, for example, "first" and "second" may be used to describe various elements, these terms are merely used to distinguish the same or similar elements from each other. Therefore, in the present specification, an element indicated by "first" may be the same as an element indicated by "second" without exceeding the technical scope of the present disclosure, unless otherwise mentioned.

The respective features of the various aspects of the present disclosure may be partially or wholly coupled to and combined with each other, and various technical linkages and modes of operation thereof are possible. These various aspects may be performed independently of each other, or may be performed in association with each other.

Figure 2:
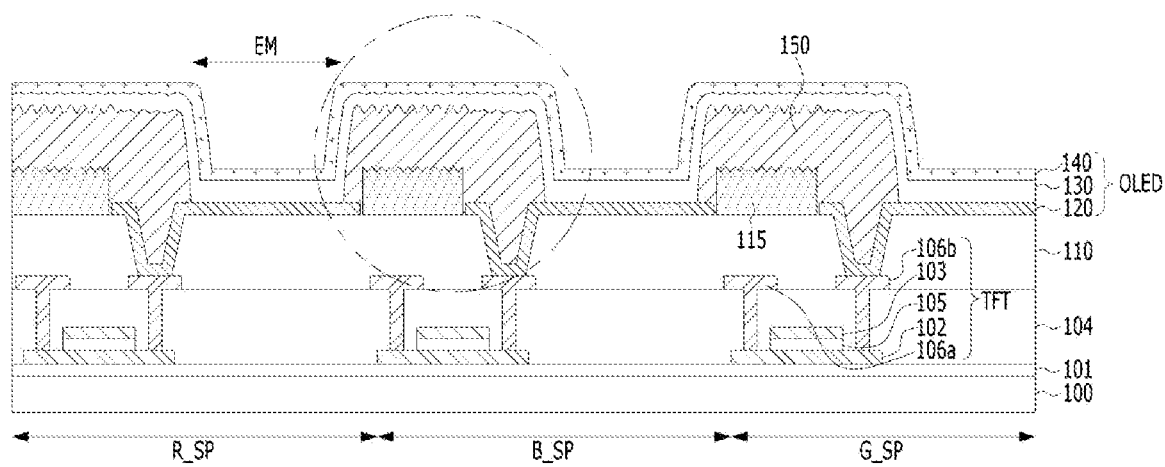
FIG. 2 is a cross-sectional view illustrating first to third subpixels of the light-emitting display device according to the present disclosure.
Figure 3:
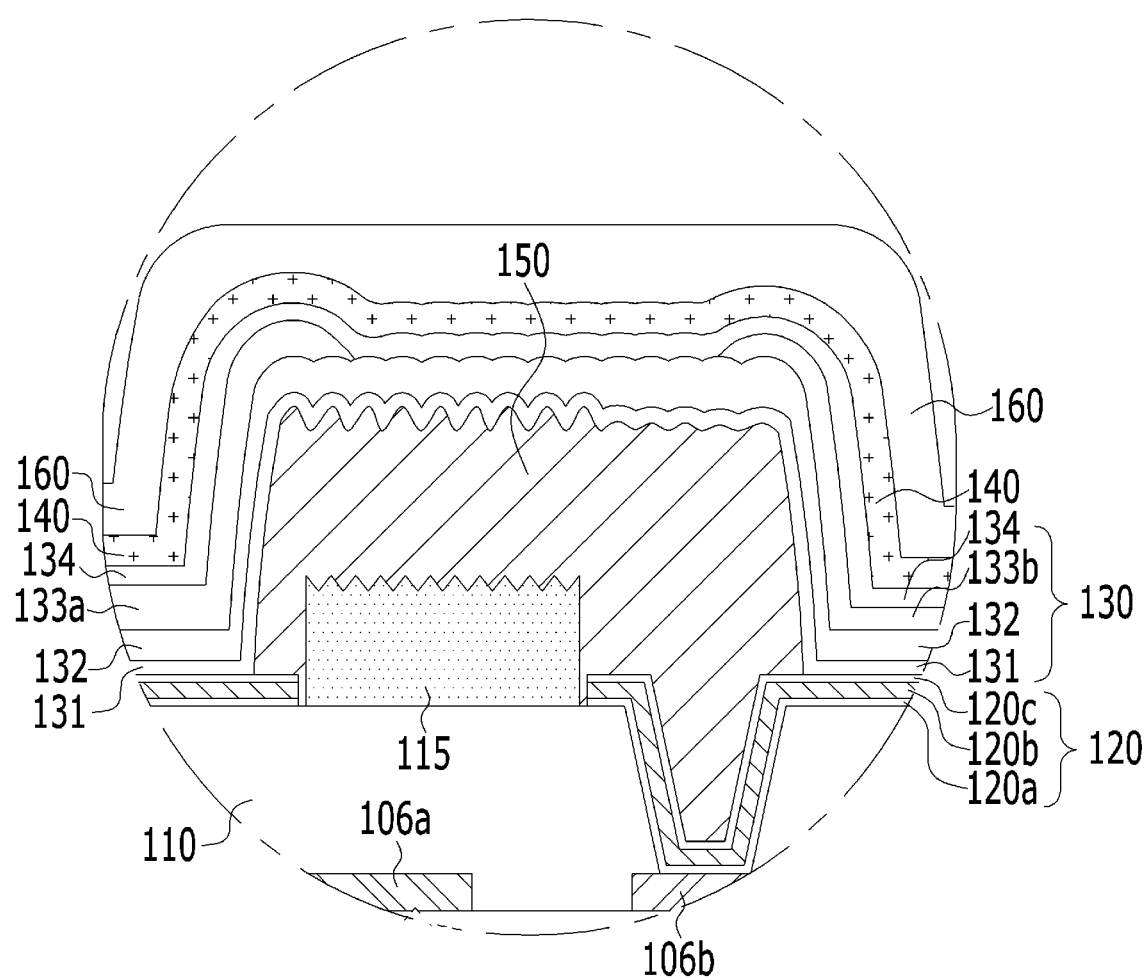
FIG. 3 is an enlarged cross-sectional view illustrating the bank region illustrated in FIG. 2.

FIG. 1 is a plan view illustrating a light-emitting display device according to the present disclosure, FIG. 2 is a cross-sectional view illustrating first to third subpixels of the light-emitting display device according to the present disclosure, and FIG. 3 is an enlarged cross-sectional view illustrating the bank region illustrated in FIG. 2.

As illustrated in FIG. 1, the light-emitting display device according to the present disclosure includes a substrate 100, which may have a polygonal shape, a rectangular shape, and various components disposed on the substrate 100.

The substrate 100 is largely divided into a display area AA formed at the center thereof and a peripheral area formed around the display area AA. Subpixels SP, each of which includes a bank 150 defining an emission part EM in an opening, are arranged in a matrix form in the display area AA.

The subpixels SP are divided by gate lines GL (GL1, GL2, . . . , GLn) and data lines DL (DL1, DL2, . . . , and DLm), which intersect each other. Driving voltage lines VDDL, to which driving voltage is applied, are further provided in the display area AA in the same direction as the data lines in order to drive a subpixel circuit PC provided in each subpixel SP. Each driving voltage line is connected to a driving thin-film transistor D-Tr, which is a part of the subpixel circuit PC.

The subpixel circuit PC, which is connected to the above lines, includes a switching thin-film transistor S-Tr disposed at the intersection between the gate line GL and the data line DL, a driving thin-film transistor D-Tr disposed between the switching thin-film transistor S-Tr and the driving voltage line VDDL, an organic light-emitting diode OLED connected to the driving thin-film transistor D-Tr, and a storage capacitor Cst disposed between a gate electrode and a drain electrode (or a source electrode) of the driving thin-film transistor D-Tr.

Here, the switching thin-film transistor S-Tr is formed at the intersection between the gate line GL and the data line DL, and functions to select a corresponding subpixel. The driving thin-film transistor D-Tr functions to drive the light-emitting diode of the subpixel selected by the switching thin-film transistor S-Tr.

A gate-driving part GD for supplying a scan signal to the gate line GL and a data-driving part DD for supplying a data signal to the data line DL are included in the peripheral area, which corresponds to the edge of the substrate 100. The driving voltage line VDDL may receive driving voltage from a first power source VDD provided in the peripheral area, or may receive driving voltage via the data-driving part DD.

Here, the gate-driving part GD, the data-driving part DD and the first power source VDD may be formed so as to be directly embedded in the peripheral area on the substrate 100 when the thin-film transistor of the display area is formed, or may be attached to the peripheral area on the substrate 100 in a separate film or printed circuit board form. In any case, these circuit-driving parts are disposed in the peripheral area around the display area. To this end, the display area AA is formed further inwards than the edge of the substrate 100.

The gate-driving part GD sequentially supplies scan signals to a plurality of gate lines GL. For example, the gate-driving part GD is a control circuit, and supplies scan signals to a plurality of gate lines GL in response to a control signal supplied from a timing controller (not illustrated).

The data-driving part DD supplies data signals to data lines DL1 to DLm selected from the data lines DL in response to a control signal supplied from an external device such as a timing controller (not illustrated). The data signals supplied to the data lines DL1 to DLm are supplied to the subpixels SP selected by the scan signals whenever the scan signals are supplied to the gate lines GL to GLn. Through this process, the subpixels SP are charged with voltage corresponding to the data signals and emit light with brightness corresponding thereto.

The substrate 100 may be an insulating substrate, which is formed of plastic, glass, ceramic, or the like. In the case in which the substrate 100 is formed of plastic, the substrate 100 may be reduced in thickness and may be flexible. However, the material of the substrate 100 is not limited thereto. The substrate 100 may include metal and may further include an insulation buffer layer provided at a portion thereof on which lines are disposed.

A plurality of subpixels SP, e.g. three or four subpixels, which emit light beams having different colors from each other, may be grouped into a pixel.

Each of the subpixels SP is a unit, in which a specific kind of color filter is provided or in which the light-emitting diode is capable of emitting a light beam having a specific color without a color filter. The colors defined by the subpixels SP include red R, green G and blue B. Depending on the aspect, the colors may further include white W. However, the present disclosure is not limited thereto.

In the following description, a structure in which an organic light-emitting diode is used as the light-emitting diode will be described by way of example. However, the present disclosure is not limited thereto. The present disclosure may be applied to any structure, so long as a common layer formed between two electrodes in the light-emitting diode is disposed in common in the subpixels.

For example, when an organic light-emitting diode OLED is used as the light-emitting diode, the organic light-emitting diode OLED is connected to the driving thin-film transistor D-Tr, and includes a first electrode provided in each subpixel, a second electrode disposed so as to face the first electrode, and an organic stack disposed between the first electrode and the second electrode. The organic stack may include an organic light-emitting layer disposed therein and an organic common layer disposed under and/or above the organic light-emitting layer.

The emission type of the light-emitting display device 10 may be classified into a top emission type, a bottom emission type, and a dual emission type. Regardless of the emission type, a light-emitting display device having a large area may undergo a voltage drop at a second electrode 140 (refer to FIGS. 2 and 3) during the process of forming the second electrode having high resistance on the entire surface of the display area AA within the substrate 100. Therefore, in order to solve this, the light-emitting display device according to the present disclosure may further include an auxiliary line, which is connected to the second electrode.

The light-emitting diode is connected to the subpixel circuit PC in each subpixel, and is selectively operated so as to function as a self-illuminating element in response to driving current applied thereto. That is, with the configuration in which the light-emitting diode is provided in each subpixel, the light-emitting display device according to the present disclosure is capable of realizing a display operation without a separate light source.

Examples of the self-illuminating element include an organic light-emitting element, an inorganic light-emitting element using quantum dots or the like, and a light-emitting element including organic and inorganic materials as a light-emitting material.

The light-emitting display device according to the present disclosure, in which the self-illuminating element is provided in each subpixel, is characterized in that the upper surface of the bank is formed to be uneven in order to increase the resistance of a common layer, which is disposed in common in the subpixels, thereby preventing current leakage between adjacent subpixels due to the use of the common layer. That is, the uneven portion of the upper surface of the bank functions to lengthen the path along which the leaked current flows, thereby preventing or minimizing the flow of leaked current between adjacent subpixels.

The structure of the light-emitting display device according to the present disclosure will now be described in detail with reference to FIGS. 2 and 3.

As illustrated in FIGS. 2 and 3, the light-emitting display device according to the present disclosure includes a substrate 100 having a plurality of subpixels SP (R_SP, G_SP and B_SP), a first electrode 120 provided in each of the subpixels SP (R_SP, G_SP and B_SP), a bank 150 defining an emission part EM in each of the subpixels SP (R_SP, G_SP and B_SP) and having an upper surface, which has a larger degree of surface roughness than the upper surface of the first electrode 120, an organic stack 130 provided over all of the subpixels SP so as to cover the first electrode 120 and the bank 150, light-emitting layers 133a and 133b provided in the emission part of each of the subpixels within the organic stack 130, and a second electrode 140 provided on the organic stack 130.

In the illustrated aspect, the first electrode 120, the organic stack 130 and the second electrode 140 function as an organic light-emitting diode OLED in each of the subpixels SP (R_SP, G_SP and B_SP).

FIG. 3 illustrates a top emission type in which the first electrode 120 of the OLED is implemented as a reflection electrode and the second electrode 140 of the OLED is implemented as a transparent electrode or a reflection-transmission electrode. However, the present disclosure is not limited thereto. Alternatively, the first and second electrodes may be reversed so as to be used for a bottom emission type. Alternatively, a region for a top emission type and a region for a bottom emission type may be used in combination. Alternatively, the first and second electrodes may be implemented as transparent electrodes so as to be used for a dual emission type.

The main feature of the light-emitting display device according to the present disclosure is the region around the emission part EM, namely the bank 150, rather than the emission part EM of the subpixel SP.

As illustrated in FIGS. 2 and 3, the upper surface of the bank 150 has a relatively large degree of surface roughness. The rough upper surface of the bank 150 is not naturally formed through the general process of forming the bank or by the physical properties of the bank. The roughness of the upper surface of the bank 150 is increased beyond a predetermined level by performing a specific treatment on the upper surface of the bank or by adding a specific configuration to a region under the bank so that the specific configuration induces a relatively large degree of surface roughness onto the upper surface of the bank.

In the present disclosure, the roughness of the upper surface of the bank 150 is evaluated by a factor Rq (root mean square average of roughness profile ordinates) used to evaluate the surface roughness, and the surface roughness will be described with reference to FIG. 4.

Figure 4:
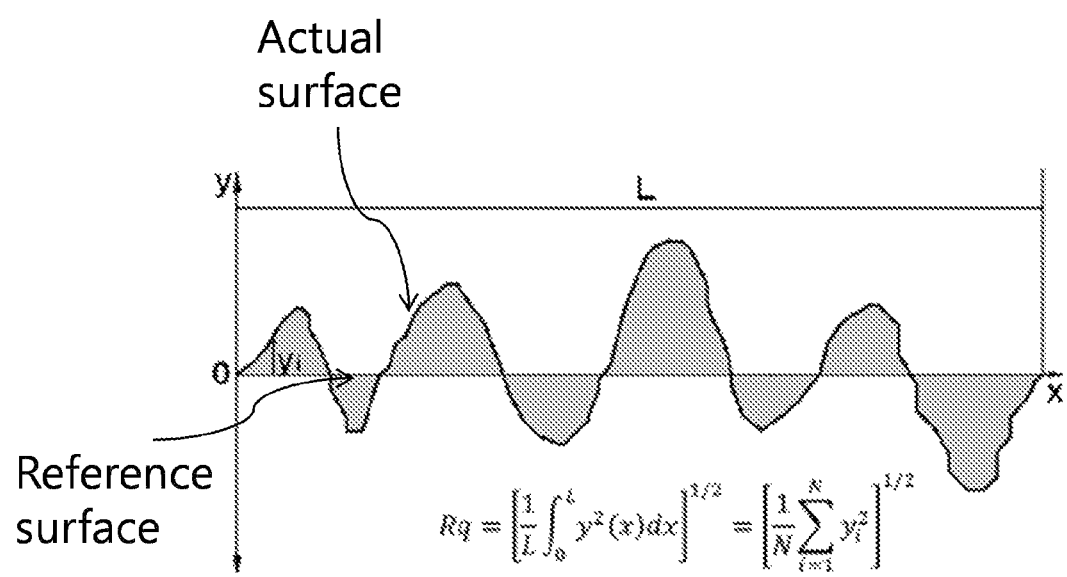
FIG. 4 is a view illustrating the definition of a surface roughness factor.

FIG. 4 is a view illustrating the definition of the surface roughness factor Rq. As illustrated in FIG. 4, the surface roughness factor Rq is obtained by measuring height variations yi of N points with respect to the reference surface, adding the squares of the variations yi of the N points with respect to the reference surface, and dividing the resulting value by N in order to calculate the square root of the resulting value. In the case of FIG. 4, the variable $y_i$ is the height of a point on the upper surface compared to a reference surface. The reference surface may be a flat surface and may extend across the profile of the undulating surface such that the variable $y_i$ takes positive and negative values, as shown in FIG. 4.

For example, when the bank is formed of a single material such as polyimide or polyamide, the surface roughness factor Rq of the upper surface of the bank is equivalent to 1.6 or less.

In the light-emitting display device according to the present disclosure, the first electrode 120 is formed as a metal layer including a reflection electrode through, for example, deposition using a sputtering method. The first electrode 120 has surface roughness that is similar to or greater than the surface roughness of the surface of the bank, which is formed through a polyimide or polyamide coating process, and has a surface roughness factor Rq of approximately 1.4 to 2.2.

In the light-emitting display device according to the present disclosure illustrated in FIGS. 2 and 3, the bank 150 is provided at the lower side thereof with a roughness-inducing layer 115 for inducing a relatively large degree of surface roughness so that the upper surface of the bank 150 has a larger degree of surface roughness than the first electrode 120. In other words, the upper surface of the bank 150 is more uneven than that of the first electrode 120. Thus, even if leaked current flows horizontally (horizontally being a direction towards a neighbouring subpixel) through the organic stack 130 formed on the first electrode 120, a path L, along which the leaked current flows, is lengthened due to the uneven upper surface of the bank 150. Thus, the resistance R between adjacent pixels, which is represented by ρ*L/A (where ρ is the specific resistance of the organic stack, L is the path created by the roughness of the upper surface of the bank, and A is the cross-sectional area, and L=the direct horizontal length of a portion of the upper surface of the bank), is increased due to the increase in the length of the path L so as to be higher than in a configuration in which a bank is formed of a single material without any specific treatment and has a flat upper surface. Thus, it is possible to minimize or prevent the flow of leaked current from one subpixel to another subpixel. As a result, it is possible to implement independent driving of the subpixel, thereby preventing, when a specific subpixel is driven, neighboring subpixels from emitting a small amount of light due to current leakage.

The roughness-inducing layer 115 functions to increase the surface roughness of the layer formed thereon, namely the bank 150 (refer to FIGS. 2 and 3). That is, the roughness-inducing layer 115 increases the value of the surface roughness factor Rq to a level equal to or greater than that of the surface of the first electrode 120. Thus, it is possible to prevent the flow of leaked current in the horizontal direction through the organic stack 130 disposed on the bank 150. The roughness-inducing layer 115 may be formed in a non-emission part.

The roughness-inducing layer 115 is disposed under the bank 150. The roughness-inducing layer 115 may be formed so as to have a relatively large degree of surface roughness. However, this is not an absolute condition. Rather, the role of the roughness-inducing layer 115 is to increase the surface roughness of the layer formed thereon. Although the inventor of the present disclosure has used a silicon oxide film as the material of the roughness-inducing layer 115, any other material may be used for the roughness-inducing layer 115, so long as it is capable of inducing an upper layer disposed thereon to be formed such that the upper surface of the upper layer has a relatively large degree of surface roughness.

Through the experiment, the inventor of the present disclosure has found that the roughness of the upper surface of the bank 150 when a silicon oxide film (SiOx) was formed with a thickness of 3600 Å and the bank 150 was formed thereon with a thickness of 1 to 3 μm using polyimide was greater than when only the bank was formed with a thickness of 1 to 3 μm using polyimide. When the roughness-inducing layer 115 such as a silicon oxide film is further provided, the surface roughness factor Rq may be larger by 0.8 or more than in the case in which a roughness-inducing layer is not provided.

Here, although the thickness of the roughness-inducing layer 115 is a third or less of the thickness of the bank 150, the roughness of the upper surface of the bank 150 is increased by the roughness-inducing layer 115. The roughness-inducing layer 115 may induce the upper surface of the bank 150 to have surface roughness equivalent to or greater than the surface roughness of the roughness-inducing layer 115.

However, not all materials may be used for the formation of the roughness-inducing layer 115. For example, in the case in which an organic material, such as polyimide, polyacryl, or BCB, is provided under the bank 150, the surface roughness factor Rq of the upper surface of the bank changes slightly. In the case in which an inorganic material such as a silicon nitride film is provided under the bank 150, the surface roughness factor Rq of the upper surface of the bank may be decreased so as to be lower than in the case in which the bank is formed of a single material. Further, it is not desirable for the roughness-inducing layer 115 to be formed of a metal material because it may have an adverse influence on the first electrode 120 of each of neighboring subpixels. Therefore, in the present disclosure, the roughness-inducing layer 115 is formed of an inorganic material such as a silicon oxide film.

In some cases, besides the roughness-inducing layer 115, plasma treatment may be performed on the upper surface of the bank 150 in order to increase the roughness of the upper surface of the bank 150. Alternatively, the application of the roughness-inducing layer 115 and the plasma treatment of the bank 150 may be performed together in order to secure greater roughness of the upper surface of the bank 150.

The components of the organic light-emitting diode OLED, other than the roughness-inducing layer 115 and the bank 150, will be described below.

The first electrode 120 is provided in each of the subpixels SP in order to implement independent light emission from each subpixel SP. As illustrated in FIG. 3, the first electrode 120 has a triple-layer structure that includes a reflection electrode 120b and further includes transparent electrodes 120a and 120c disposed under and on the reflection electrode 120b. However, the present disclosure is not limited thereto. The first electrode 120 may be formed in a single-layer structure including only a reflection electrode 120b, or may be formed in a double-layer structure including a reflection electrode 120b and a transparent electrode 120a or 120c disposed under or on the reflection electrode 120b. Alternatively, the first electrode 120 may be formed in a multi-layer structure in which reflection electrodes and transparent electrodes are alternately stacked on one another.

The organic stack 130 is formed by stacking a hole injection layer 131, a hole transport layer 132, a light-emitting layer 133a and 133b, and an electron transport layer (or an electron injection layer) 134 in that order from the bottom in each subpixel. The organic stack 130 may include the light-emitting layer 133a and 133b as an essential element, and may further optionally include the remaining layers. Each layer may be formed in a single-layer or multi-layer structure.

The hole injection layer 131, the hole transport layer 132 and the electron transport layer (or the electron injection layer) 134 are provided in common in the subpixels SP (R_SP, G_SP and B_SP), and thus are referred to as common layers. As illustrated in the drawings, the above layers may be formed as organic layers, or may be formed such that an inorganic material is included in portions of the organic layers. Alternatively, in the case in which an inorganic light-emitting diode is used instead of the illustrated organic light-emitting diode, an inorganic layer may be included.

Depending on the aspect, an electron-blocking layer and a hole-blocking layer may be further formed so as to be in direct contact with the lower surface and the upper surface of the light-emitting layer 133a and 133b. However, the electron-blocking layer and the hole-blocking layer are not essential elements, but may be selectively provided as needed. The electron-blocking layer and the hole-blocking layer may be selectively provided in some of the subpixels defined in the substrate 100.

As illustrated in FIG. 3, the light-emitting layer 133a and the light-emitting layer 133b are patterned so as to be separated from each other in each subpixel. However, the present disclosure is not limited thereto. In the case of a tandem type, the light-emitting layer may be provided as a common layer over all of the subpixels.

The first electrode 120 is connected to a thin-film transistor TFT and is selectively driven.

A buffer layer 101 is formed on the substrate 100, and a thin-film transistor TFT is formed on the buffer layer 101. The thin-film transistor TFT includes a semiconductor layer 102, a gate insulation film 105 and a gate electrode 103 disposed on the semiconductor layer 102, and a source electrode 106a and a drain electrode 106b connected to respective sides of the semiconductor layer 102.

The semiconductor layer 102 may be formed of any one of amorphous silicon, crystalline silicon, and an oxide semiconductor, or may be formed by stacking at least one of the above materials.

An interlayer insulation film 104 is provided so as to cover the semiconductor layer 102 and the gate electrode 103, except for the portions at which the source electrode 106a and the drain electrode 106b are connected to the semiconductor layer 102.

A protective film 110 is formed so as to cover the source electrode 106a, the drain electrode 106b and the interlayer insulation film 104. The protective film 110 is disposed under the first electrode 120 in order to protect the thin-film transistor TFT, and helps flatten the surface on which the first electrode 120 is formed.

In addition, a capping layer 160 is formed on the entire upper surface of the second electrode 140 in order to assist light extraction from the second electrode 140 and to protect the organic light-emitting diode OLED. The capping layer 160 is formed of a transparent organic material that has a refractive index of approximately 1.6 to 2.2. Depending on the aspect, the capping layer 160 may be optionally formed.

In the light-emitting display device according to the present disclosure, the upper surface of the bank 150, which defines the light-emitting part EM of each subpixel SP, has large surface roughness, which results in an increase in the length of the path along which the current flows horizontally through the surface of the organic stack 130 disposed on the upper surface of the bank 150.

Hereinafter, a light-emitting display device according to another aspect of the present disclosure having another example of the organic stack will be described.

Figure 5:
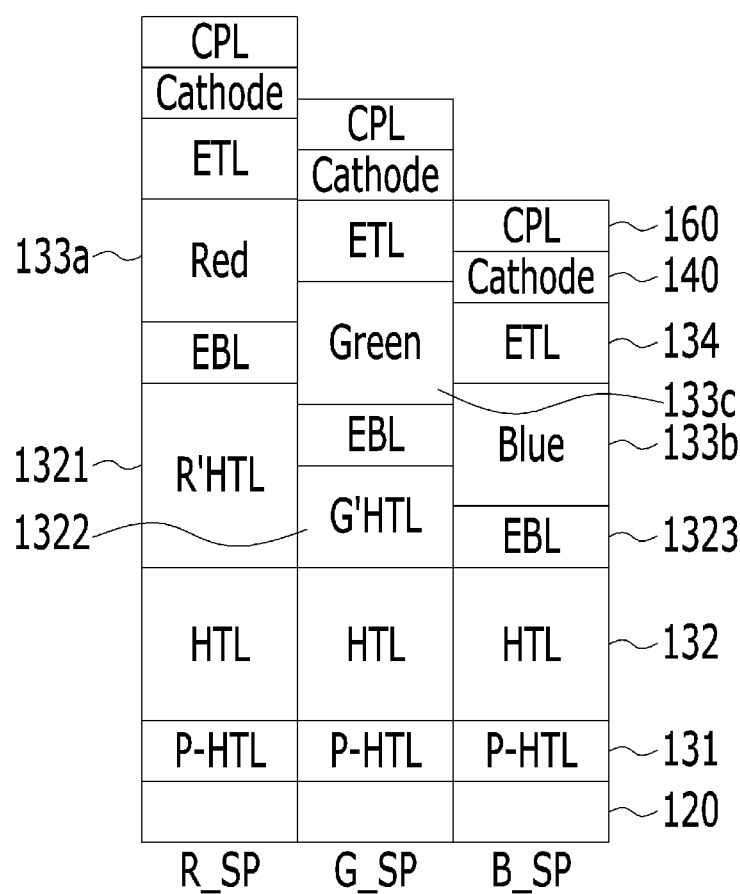
FIG. 5 is a cross-sectional view illustrating a modified example of the organic light-emitting diode illustrated in FIG. 3.

FIG. 5 is a cross-sectional view illustrating a modified example of the organic light-emitting diode of the light-emitting display device according to the present disclosure.

As illustrated in FIG. 5, a modified example of the organic light-emitting diode of the light-emitting display device according to the present disclosure further includes additional layers compared to the configuration illustrated in FIG. 3. Described in detail, when it is necessary to adjust the position of the light-emitting layer 133a and 133c between the first and second electrodes 120 and 140 in the subpixels provided on the substrate, a hole transport auxiliary layer 1321 and 1322 is additionally provided between the hole transport layer 132 and the light-emitting layer 133a and 133c, and an electron-blocking layer EBL 1323 is provided in common between the hole transport layer or the hole transport auxiliary layer 1321 and 1322 and the light-emitting layer 133a, 133b and 133c. An electron transport layer 134 is provided as a common layer between the light-emitting layer 133a, 133b and 133c and the second electrode 140.

For example, red, green and blue subpixels R_SP, G_SP and B_SP may be provided on the substrate 100. With regard to a light-emitting layer having a relatively long wavelength, the position of the light-emitting layer 133a and 133c may be adjusted in order to increase the optical distance from the first electrode 120.

The thickness of the hole transport auxiliary layer 1321 in the red subpixel R_SP, having a relatively long wavelength, is greater than the thickness of the hole transport auxiliary layer 1322 in the green subpixel G_SP, having a relatively short wavelength.

As illustrated in FIGS. 3 and 5, in the case in which the light-emitting layer is patterned for each light color in each subpixel, a portion of the light-emitting layer 133a, 133b and 133c is not formed above the bank 150. Thus, the area in which the common layers 131, 132 and 134 overlap the substrate 100 may be larger than the area in which the light-emitting layer 133a, 133b and 133c overlaps the substrate 100.

Figure 6:
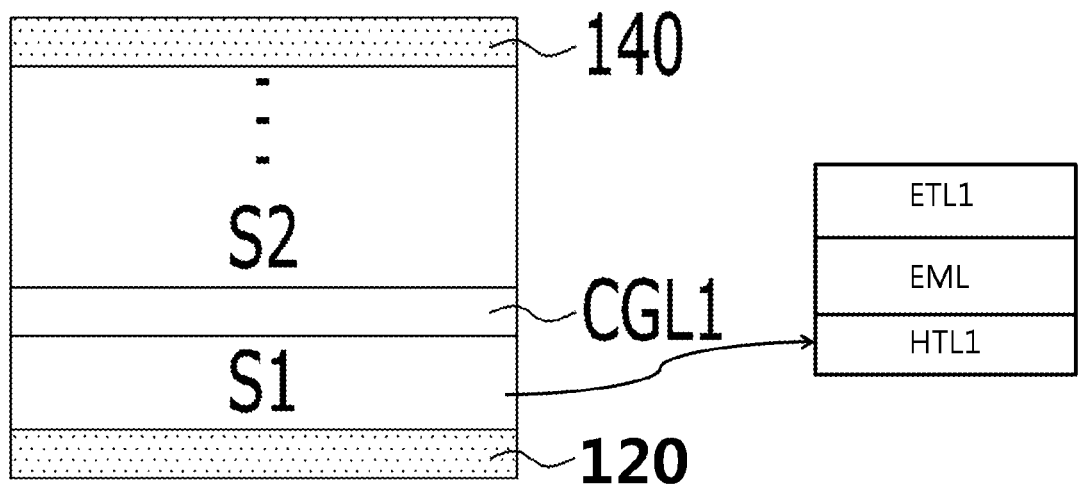
FIG. 6 is a cross-sectional view illustrating an organic light-emitting diode of a light-emitting display device according to another aspect of the present disclosure.

FIG. 6 is a cross-sectional view illustrating an organic light-emitting diode of a light-emitting display device according to another aspect of the present disclosure.

An organic light-emitting diode of a light-emitting display device according to another aspect of the present disclosure illustrated in FIG. 6 includes an organic stack, disposed between the first electrode 120 and the second electrode 140, and a plurality of stacks with a charge generation layer CGL interposed therebetween.

Each stack may include a light-emitting layer EML and further includes a first common layer HTL1 and a second common layer ETL1 respectively disposed under and on the light-emitting layer EML. The first common layer HTL1 may include at least one layer of a hole injection layer, a hole transport layer, or an electron-blocking layer. The second common layer ETL1 may include at least one layer of a hole-blocking layer, an electron transport layer, or an electron injection layer.

The configuration illustrated in FIG. 6 is a tandem-type configuration. Like the first and second common layers HTL1 and ETL1, the light-emitting layer EML is also disposed over all of the subpixels. The light-emitting layer EML and the first and second common layers HTL1 and ETL1 are integrally formed with each other in all of the regions in the display area. That is, the stacks including the light-emitting layer EML are integrally formed in all of the regions, and thus the stacks are also disposed on the bank. In addition, in the light-emitting display device according to the present disclosure, due to the uneven upper surface of the bank 150 disposed between adjacent subpixels, the path along which leaked current flows is lengthened, thereby preventing the flow of leaked current between adjacent subpixels.

The light-emitting display device according to the present disclosure is characterized in that the upper surface of the bank has great surface roughness so as to prevent the flow of leaked current between adjacent subpixels, and is applicable to any type of organic light-emitting diode, layers of which are disposed in common in the subpixels.

Hereinafter, a comparative example and aspects of the present disclosure with respect to the shape of the bank, excluding the emission part EM, will be described in detail.

Figure 7:
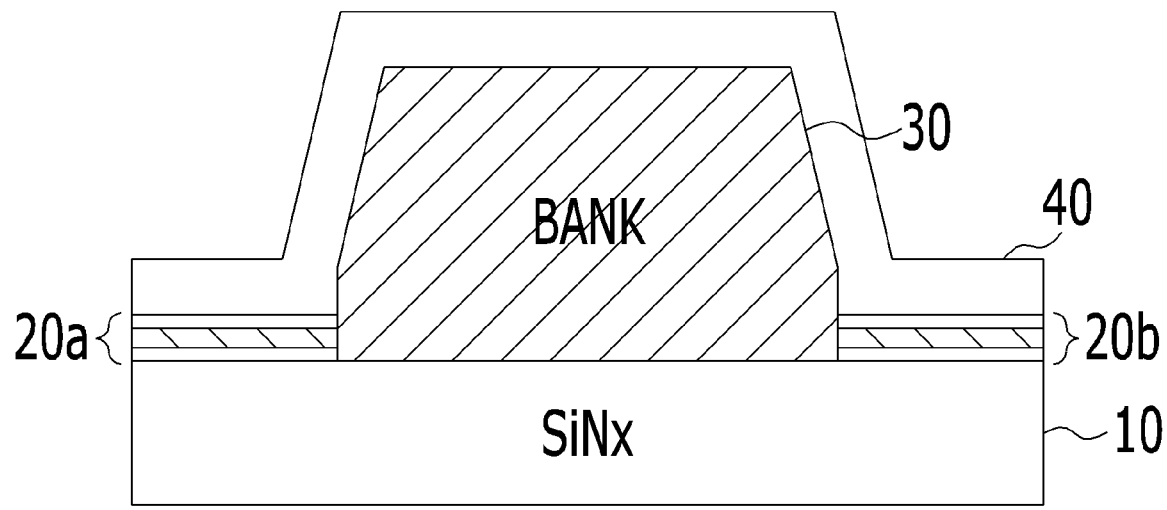
FIG. 7 is a cross-sectional view illustrating a bank and a peripheral portion of a light-emitting display device according to a comparative example.

FIG. 7 is a cross-sectional view illustrating a bank and a peripheral portion of a light-emitting display device according to a comparative example.

As illustrated in FIG. 7, the light-emitting display device according to a comparative example includes subpixels, in each of which a first electrode 20a or 20b is disposed on a protective layer 10 and a bank 30 is disposed in a region on the protective layer 10, rather than in an emission part. In this case, the upper surface and the side surface of the bank 30 have a surface roughness factor Rq of approximately 1.2. A common layer 40, which is formed of an organic material, may be disposed on the bank 30 and the first electrode 20a or 20b. In each subpixel, the upper surface of the first electrode 20a or 20b and the upper surface of the bank 30 may have uniform surface roughness, or the roughness of the upper surface of the bank 30 may be less than the roughness of the upper surface of the first electrode 20a or 20b, whereby the horizontal path of the common layer 40 that is formed above the bank 30 disposed between the first electrode 20a of one subpixel and the first electrode 20b of a neighboring subpixel may be shortened. Thus, after a second electrode (not illustrated) is formed on the entire surface of the common layer 40, for example, when the left subpixel emits light due to a vertical electric field generated by applying voltage to the first electrode 20a and the second electrode of the left subpixel, current leaks horizontally due to the common layer 40 that is provided in common in adjacent subpixels, which causes unintended light emission from the right subpixel.

Figure 8A:
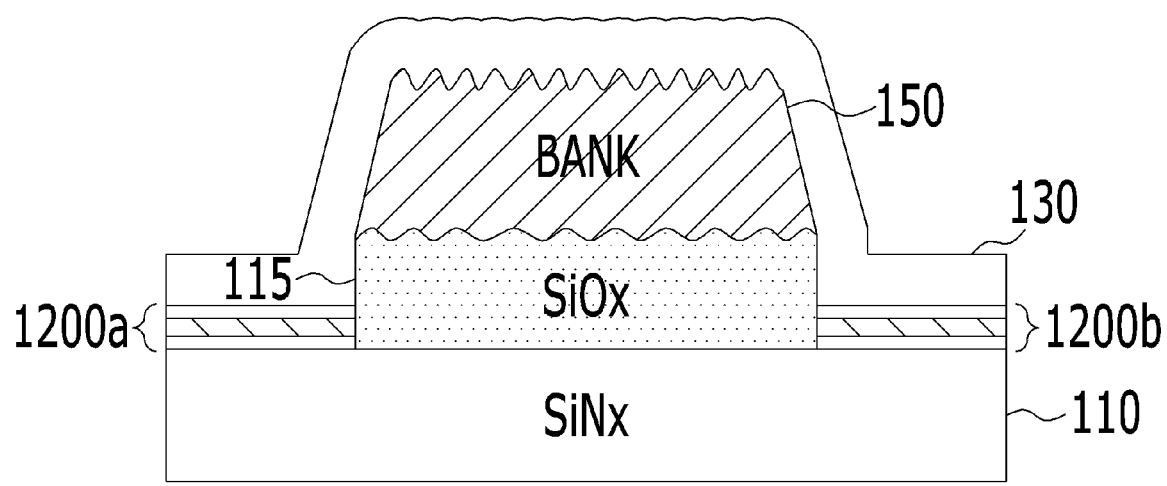
FIGS. 8A and 8B are cross-sectional views illustrating a bank and a peripheral portion according to first and second aspects of the light-emitting display device according to the present disclosure.
Figure 8B:
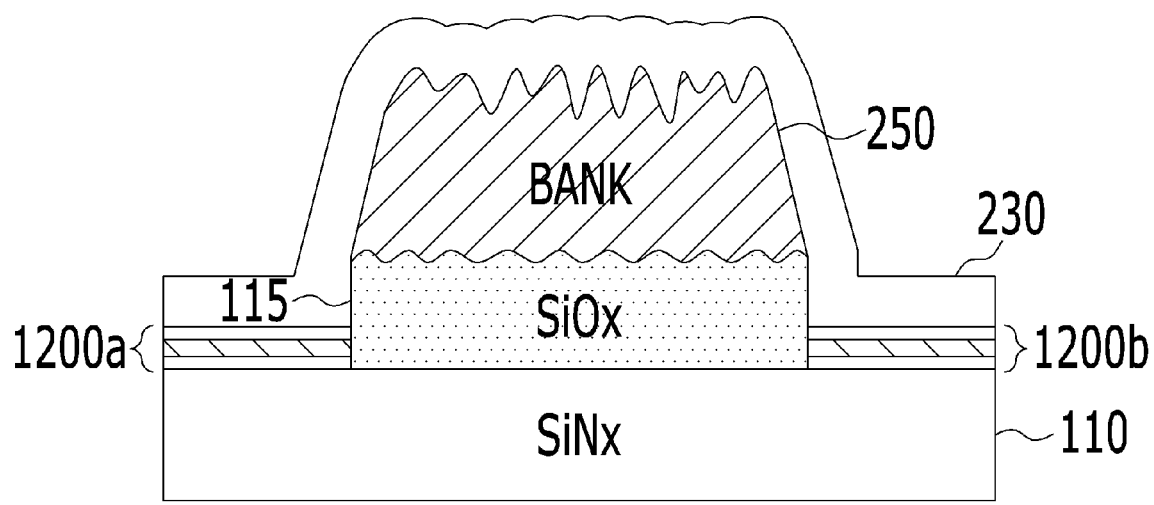

FIGS. 8A and 8B are cross-sectional views illustrating a bank and a peripheral portion according to first and second aspects of the light-emitting display device according to the present disclosure.

As illustrated in FIG. 8A, in the light-emitting display device according to the first aspect of the present disclosure, a roughness-inducing layer 115, which is formed of silicon oxide film (SiOx), is disposed under a bank 150 in order to increase the roughness of the upper surface of the bank 150 so that convex and concave portions are formed in the upper surface of the bank 150. According to the first aspect of the present disclosure, the bank 150 has the convex and concave portions formed in the upper surface thereof, but no specific treatment is performed during the process of forming the bank 150, like the bank-forming process illustrated in FIG. 7. It is presumed that the formation of the convex and concave portions in the upper surface of the bank 150 is caused by surface repulsive force between the roughness-inducing layer 115, which is formed of a silicon oxide film, and the material forming the bank 150.

Thus, the first electrode 1200a or 1200b, which is disposed in the region in which the roughness-inducing layer 115 is not formed, has a flat upper surface. Subsequently, an organic stack 130 is disposed on the first electrode 1200a or 1200b and the bank 150. The portion of the organic stack 130 that is disposed on the first electrode 1200a or 1200b, which corresponds to an emission part EM (refer to FIG. 2) of each of adjacent subpixels SP, is formed along the flat upper surface of the first electrode 1200a or 1200b, and the portion of the organic stack 130 that is disposed on the bank 150 is formed along the convex and concave portions of the upper surface of the bank 150, which has large surface roughness. Thus, the path created by the organic stack 130 on the upper surface of the bank 150 is lengthened. As a result, the resistance of the organic stack 130 including common layers above the bank 150 is increased, thereby reducing the influence due to current leakage in the horizontal direction.

The first electrode 1200a of one subpixel and the first electrode 1200b of a neighboring subpixel may be formed so as to overlap the bank 150 while being spaced apart from each other. In this case, the first electrodes 1200a and 1200b may also overlap the roughness-inducing layer 115 disposed under the bank 150.

The organic stack 130 may be formed using all or some of the hole injection layer, the hole transport layer, the electron-blocking layer, the hole-blocking layer, the light-emitting layer, the electron transport layer, and the electron injection layer, which have been described with reference to FIGS. 2, 3, 5 and 6. As illustrated in FIGS. 3 and 5, the light-emitting layer may be formed only in the emission part EM of the subpixel SP, or may be individually formed in each subpixel SP. Alternatively, as illustrated in FIG. 6, the light-emitting layer may be formed in an integral type over all of the subpixels SP in the display area AA (refer to FIG. 1). In any case, in the light-emitting display device having the organic light-emitting diode according to the first aspect of the present disclosure, it is possible to prevent or reduce the flow of leaked current between adjacent subpixels by forming the convex and concave portions in the upper surface of the bank 150.

If the thickness of the roughness-inducing layer 115 is too small, this may not cause a change in the roughness of the upper surface of the bank 150 formed thereon. Thus, it is desirable for the roughness-inducing layer 115 to have a thickness of 1000 Å or more. On the other hand, if the thickness of the roughness-inducing layer 115 is too large, this may cause a change in the roughness of the upper surface of the bank 150, but deposition processing needs to be carried out multiple times. Thus, it may be for the roughness-inducing layer 115 to have a thickness of 5000 Å or less in order to simplify deposition processing. The roughness-inducing layer 115 may be formed to have a smaller thickness than the bank 150 so as to simplify deposition processing and to change the roughness of the upper surface of the bank 150.

In particular, among the layers of the organic stack 130, the portion of the common layer that is disposed closest to the first electrode 1200a or 1200b may have a large influence on current leakage in the horizontal direction. As illustrated in the drawings, when the bank 150 has large convex and concave portions in the upper surface thereof, the difference in the surface roughness between the portion of the common layer that is disposed closest to the upper surface of the bank 150 and the portion of the common layer that is disposed on the first electrode 1200a or 1200b is the greatest. In this case, the common layer may be formed with an irregular thickness, or may be partially cut on the upper surface of the bank 150, thereby blocking the path along which leaked current flows in the horizontal direction toward a neighboring subpixel.

Although it is illustrated that the first electrode 1200a or 1200b and the roughness-inducing layer 115 are formed on the protective layer 110 formed of a silicon nitride film (SiNx), the material of the protective layer 110 is not limited to a silicon nitride film, but may include an organic planarization material such as BCB or photoacryl. Even when the protective layer 110 is formed of a material other than a silicon nitride film, it is possible to increase the roughness of the upper surface of the bank 150 by forming the roughness-inducing layer 115 under the bank 150.

FIG. 8B is a cross-sectional view of the light-emitting display device according to the second aspect of the present disclosure, in which a roughness-inducing layer 115 is provided under a bank 250 and in which plasma treatment is performed on the upper surface of the bank 250 in order to further increase the roughness of the upper surface of the bank 250 and to cause the surface roughness thereof to change more irregularly than in the light-emitting display device according to the first aspect of the present disclosure.

Thus, the first electrode 1200a or 1200b, which is disposed in the region in which the roughness-inducing layer 115 is not formed, has a flat upper surface. Subsequently, an organic stack 230 is disposed on the first electrode 1200a or 1200b and the bank 250. The portion of the organic stack 230 that is disposed on the first electrode 1200a or 1200b, which corresponds to an emission part EM (refer to FIG. 2) of each of adjacent subpixels SP, is formed along the flat upper surface of the first electrode 1200a or 1200b, and the portion of the organic stack 230 that is disposed on the bank 250 is formed along the convex and concave portions of the upper surface of the bank 250, which has large surface roughness. Thus, the path created by the organic stack 230 on the upper surface of the bank 250 is lengthened. As a result, the resistance of the organic stack 230 including common layers above the bank 250 is increased, thereby reducing the influence due to current leakage in the horizontal direction.

As illustrated in FIG. 8A, when the roughness-inducing layer 115 is provided under the bank 150, the surface roughness factor Rq of the upper surface of the bank 150 is increased to approximately 2.4. As illustrated in FIG. 8B, when the roughness-inducing layer 115 is provided under the bank 250 and plasma treatment is performed on the upper surface of the bank 250, the surface roughness factor Rq of the upper surface of the bank 250 is increased to approximately 4.0. That is, the roughness of the upper surface of the bank in the configuration of FIG. 8B is changed more than in the configuration of FIG. 8A.

Figure 9:
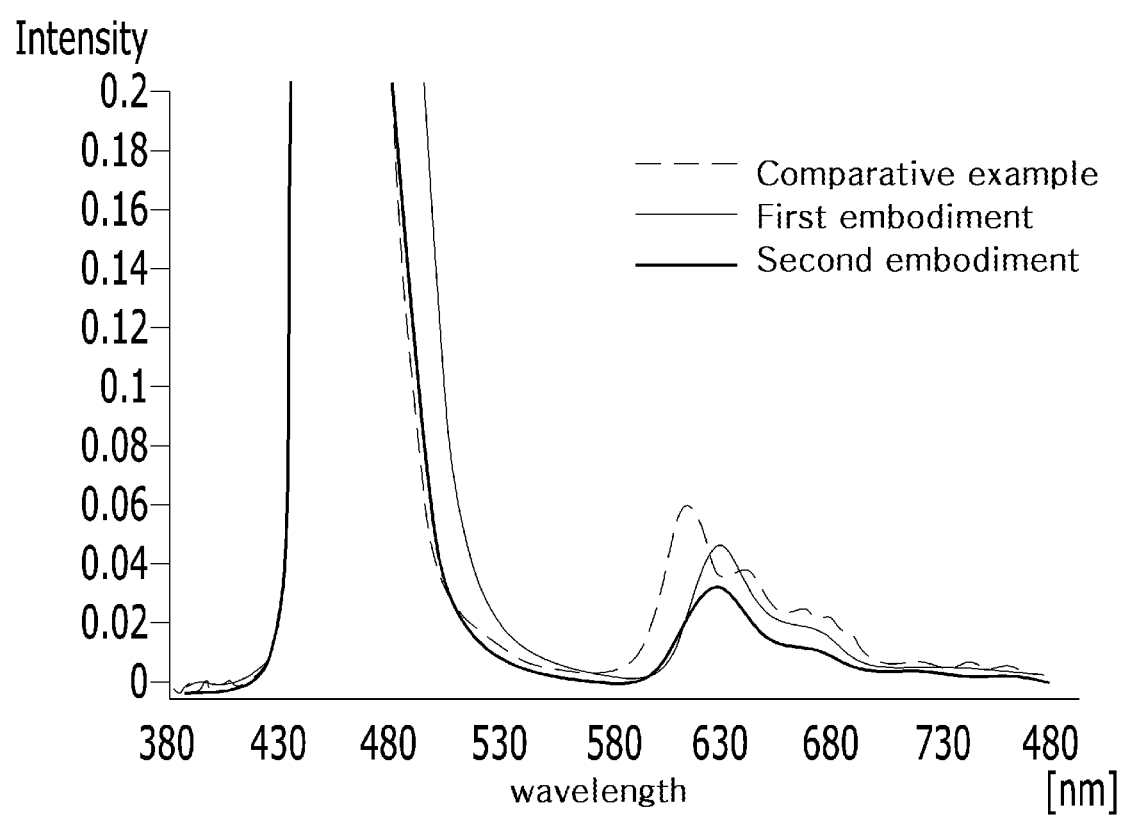
FIG. 9 is a graph showing intensity at each wavelength during the light-emitting operation of a blue subpixel in the comparative example and the light-emitting display devices according to the first and second aspects of the present disclosure.

FIG. 9 is a graph showing intensity at each wavelength during the light-emitting operation of a blue subpixel in the comparative example and the light-emitting display devices according to the first and second aspects of the present disclosure.

In the above-described comparative example and the light-emitting display devices according to the first and second aspects of the present disclosure, on the assumption that the left subpixel disposed on the left of the bank 30, 150 and 250 is a blue subpixel and that the right subpixel disposed on the right of the bank 30, 150 and 250 is a red subpixel, if voltage is applied only to the first electrode 20a and 1200a of the blue subpixel but is not applied to the first electrode 20b and 1200b of the neighboring red subpixel, a vertical electric field is generated in the first electrode 20a and the second electrode in the blue subpixel, and a blue light beam having a peak wavelength in the range from 430 nm to 480 nm is emitted (because the maximum intensity of blue light at the peak wavelength is 0.2 or greater, it is not observed in the graph). However, in the comparative example, even if no voltage is applied to the first electrode 20b in the red subpixel, which is adjacent to the blue subpixel, it is observed in the graph that a red light beam having an intensity of 0.058 at a peak wavelength in the range from 600 nm to 650 nm is emitted due to horizontal current leakage through the common layer 40.

In the case of the first aspect of the present disclosure, it is observed in the graph that a red light beam having an intensity of 0.042 at a peak wavelength in the range from 600 nm to 650 nm is emitted from the red subpixel. In the case of the second aspect of the present disclosure, it is observed in the graph that a red light beam having an intensity of 0.038 at a peak wavelength in the range from 600 nm to 650 nm is emitted from the red subpixel. That is, the intensity of light emitted from the red subpixel due to current leakage in the first and second aspects of the present disclosure is greatly reduced compared to that in the comparative example. Depending on the aspect, it is possible to further reduce the amount of light emitted from the red subpixel due to current leakage by further increasing the roughness of the upper surface of the bank 150 or 250 or causing the surface roughness thereof to change more irregularly.

When the blue subpixel is driven, a blue light beam having an intensity of 0.3 or greater at a peak wavelength is emitted. The intensity of the red light at a peak wavelength emitted from the red subpixel in the second aspect of the present disclosure is 0.038, which is an eighth or less of the intensity of the blue light at a peak wavelength. Thus, even if a red light beam is emitted from the device, it may not be visible to an observer. That is, according to the light-emitting display device of the present disclosure, it is possible to prevent undesirably emitted light due to current leakage from being visible to an observer by increasing the roughness of the upper surface of the bank to a predetermined level or higher.

Hereinafter, the change in the roughness of the upper surface of the bank measured depending on various con-figurations formed under the bank will be described.

FIGS. 10A to 10F are cross-sectional views showing the roughness of the upper surface of the bank depending on various configurations of the layer formed under the bank.

Figure 10A:
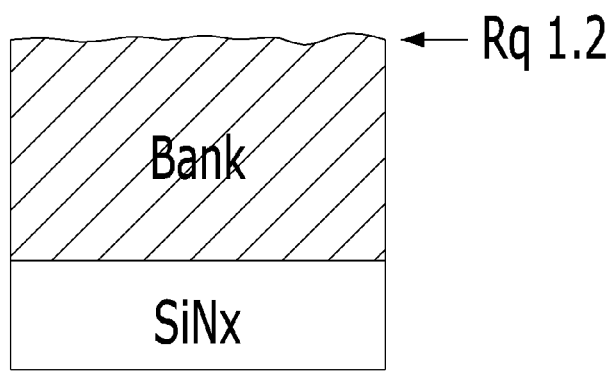
FIGS. 10A to 10F are cross-sectional views showing the roughness of the upper surface of a bank depending on various configurations of a layer formed under the bank.

As illustrated in FIG. 10A, when a silicon nitride film (SiNx) is provided under a bank, the surface roughness factor Rq of the upper surface of the bank becomes 1.2. This means that the surface roughness is generally low when the protective film is formed of a silicon nitride film and the bank is formed thereon.

Figure 10B:
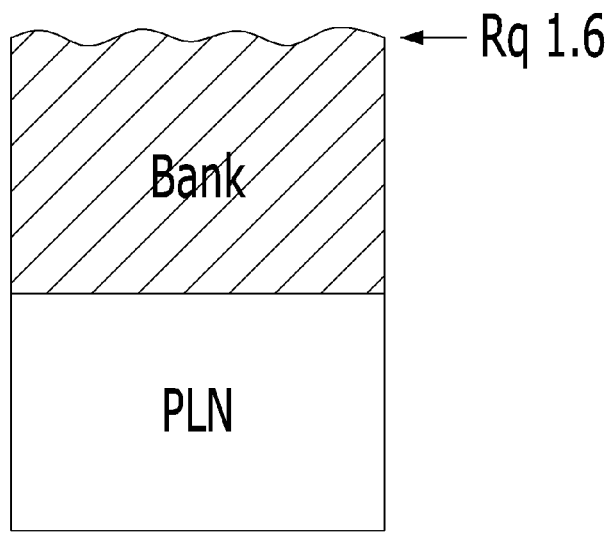

As illustrated in FIG. 10B, when a planarization layer PLN is formed of photoacryl and a bank is subsequently formed thereon, the surface roughness factor Rq of the upper surface of the bank becomes 1.6.

Figure 10C:
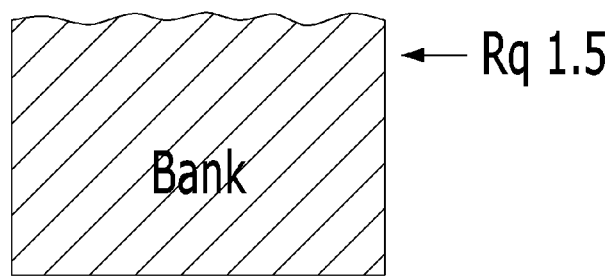

As illustrated in FIG. 10C, when no layer is formed under a bank, the surface roughness factor Rq of the upper surface of the bank becomes 1.5.

Figure 10D:
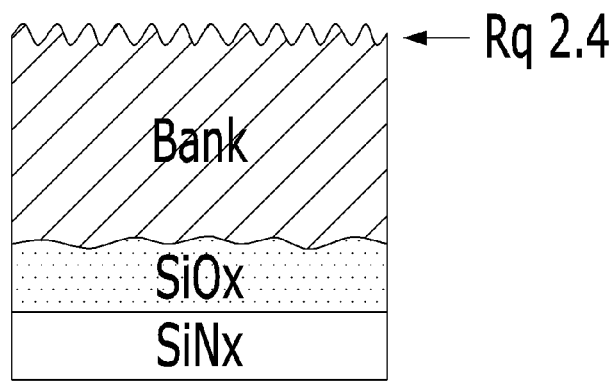

As illustrated in FIG. 10D, when a silicon nitride film (SiNx) and a silicon oxide film (SiOx) are sequentially formed and a bank is subsequently formed thereon, the surface roughness factor Rq of the upper surface of the bank becomes 2.4.

Figure 10E:
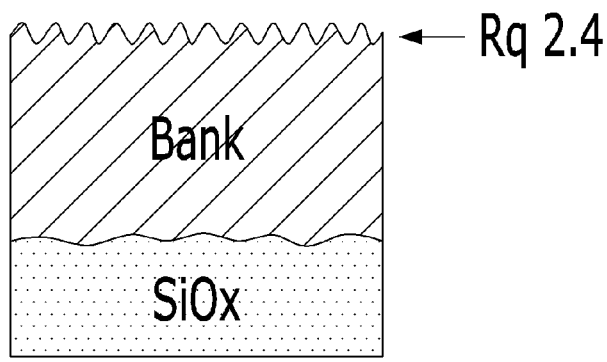

As illustrated in FIG. 10E, when a single silicon oxide film (SiOx) is formed and a bank is subsequently formed thereon, the surface roughness factor Rq of the upper surface of the bank becomes 2.4.

Based on the surface roughness factors of the upper surface of the bank obtained from the configurations illustrated in FIGS. 10A, 10D and 10E, it is confirmed that, when a silicon nitride film (SiNx) is provided under the bank, the roughness of the upper surface of the bank is decreased, and that, when a silicon oxide film (SiOx) is provided under the bank, particularly so as to contact the bank, the roughness of the upper surface of the bank is increased.

Figure 10F:
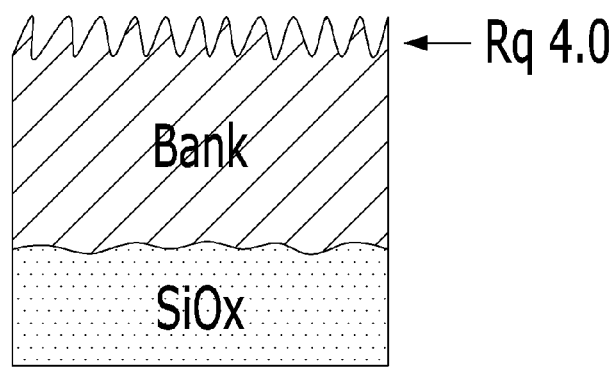

As illustrated in FIG. 10F, after a bank is formed on a single silicon oxide film (SiOx) (shown in FIG. 10E), plasma surface treatment is performed on the upper surface of the bank. In this case, the surface roughness factor Rq of the upper surface of the bank is increased to 4.0.

The plasma surface treatment may use gas having low activation energy, such as nitrogen gas ($N_2$ gas), rather than oxygen gas ($O_2$ gas), as reaction gas in order to increase only the roughness of the upper surface of the bank without having an influence on other regions. If plasma treatment is performed using reaction gas including oxygen gas ($O_2$ gas), which has high activation energy, such as $N_2O_2$, the upper surface of the bank is etched more than necessary, and thus the convex and concave portions in the upper surface of the bank are decreased in size. Therefore, nitrogen gas ($N_2$ gas) is used as plasma reaction gas in order to increase the roughness of the upper surface of the bank and to cause the convex and concave portions in the upper surface of the bank to be formed more irregularly while maintaining the convex and concave characteristics of the upper surface of the bank.

TABLE 1

| Experimental Example | Class. | Gas Composition ($N_2$:$O_2$) | Power (W) | Time (Sec) | 1st (Rq) | 2nd (Rq) | Average (Rq) |
| --- | --- | --- | --- | --- | --- | --- | --- |
| 1 | $N_2O_2$ | 9:1 | 600 | 150 | 2.6 | 2.3 | 2.4 |
| 2 | Plasma | 8:2 | | | 2.5 | 2.5 | 2.5 |
| 3 | $N_2$ Plasma | 10:0 | 600 | 150 | 4.1 | 3.9 | 4.0 |

As is seen from Table 1, although the plasma treatment is performed using the same power during the same time period, the values of the roughness of the upper surface of the bank obtained through the plasma treatment are different depending on plasma reaction gas used in the surface treatment of the bank. In detail, the surface roughness factor Rq of the upper surface of the bank obtained through Experimental Examples 1 and 2, in which reaction gas including oxygen gas is used, ranges from 2.4 to 2.5, whereas the surface roughness factor Rq of the upper surface of the bank obtained through Experimental Example 3, in which only nitrogen gas is used as reaction gas, is 4.0. In other words, the plasma surface treatment using only nitrogen gas as reaction gas further increases the surface roughness.

TABLE 2

| Experimental Example | Lower Layer | Plasma | | | Position | 1st (Rq) | 2nd (Rq) | Average (Rq) |
| --- | --- | --- | --- | --- | --- | --- | --- | --- |
| | | Gas (N$_2$:O$_2$) | Power (W) | Time (Sec) | | | | |
| 3 | SiOx | 10:0 | 600 | 150 | Bank | 4.1 | 3.9 | 4.0 |
| 4 | | | | | First Electrode | 2.5 | 2.4 | 2.5 |
| 5 | SiOx | No Plasma Treatment | | | Bank | 2.4 | 2.5 | 2.4 |
| 6 | | | | | First Electrode | 2.2 | 2.5 | 2.3 |
| 7 | SiNx | | | | Bank | 1.3 | 1.2 | 1.2 |
| 8 | | | | | First Electrode | 2.5 | 2.4 | 2.5 |

As is seen from Table 2, when a silicon oxide film is used as a lower film that is disposed under the bank (refer to Experimental Example 3), the surface roughness factor Rq of the upper surface of the bank is 4.0, whereas when a silicon oxide film is disposed under the first electrode (refer to Experimental Example 4), the surface roughness factor Rq of the upper surface of the first electrode is 2.5. That is, even if plasma treatment is performed, the change in the roughness of the upper surface of the first electrode is not large. Therefore, according to the light-emitting display device of the present disclosure, after the first electrode is formed, a silicon oxide film is formed as the roughness-inducing layer, and the bank defining the emission part is subsequently formed. Thereafter, surface treatment is performed on the entire upper surface of the bank and the entire upper surface of the first electrode. As a result, only the roughness of the upper surface of the bank changes greatly, thereby effectively preventing the flow of leaked current above the bank. When a silicon oxide film (SiOx) is used as the lower film but plasma treatment is not performed (refer to Experimental Examples 5 and 6), the surface roughness factor Rq of the upper surface of the bank is only slightly larger than the surface roughness factor of the upper surface of the first electrode. Thus, the effect of preventing the flow of leaked current above the bank is anticipated to be smaller than when the plasma treatment is performed (refer to Experimental Examples 3 and 4).

Experimental Examples 7 and 8 show the surface roughness factor Rq of the upper surface of the first electrode and the surface roughness factor Rq of the upper surface of the bank in the configuration in which a silicon nitride film (SiNx) is formed as the lower film, the first electrode is formed thereon, and the bank defining an emission part is formed, and when no surface treatment is applied to this configuration. The surface roughness factor Rq of the upper surface of the bank is 1.2 (refer to Experimental Example 7), and the surface roughness factor Rq of the upper surface of the first electrode is 2.5 (refer to Experimental Example 8). In the configuration illustrated in FIG. 7, because the roughness of the upper surface of the bank is relatively small, the resistance of the upper surface of the bank is decreased. Thus, when a specific subpixel is driven, a large amount of light is emitted from a neighboring subpixel due to current leakage and is visible to an observer.

Hereinafter, a method of manufacturing the light-emitting display device according to the present disclosure will be described with reference to FIGS. 3, 11 and 12.

Figure 11:
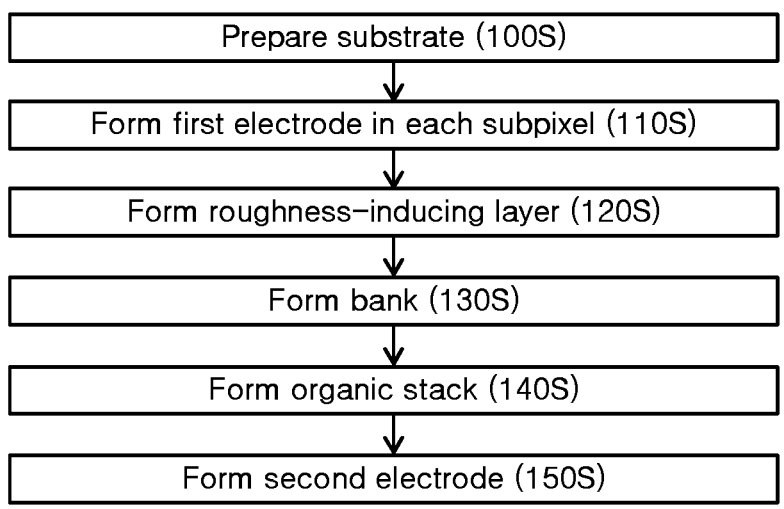
FIG. 11 is a process flow chart showing a method of manufacturing the light-emitting display device according to the first aspect of the present disclosure.

FIG. 11 is a process flow chart showing the method of manufacturing the light-emitting display device according to the first aspect of the present disclosure.

As illustrated in FIGS. 3 and 11, the method of manufacturing the light-emitting display device according to the first aspect of the present disclosure includes the following processes.

A substrate 100 having a plurality of subpixels SP (R_SP, G_SP and B_SP) is prepared (100S). Here, a thin-film transistor TFT is included in each subpixel SP of the substrate 100, as illustrated in FIG. 3.

Subsequently, a first electrode 120 is provided in each of the subpixels SP (R_SP, G_SP and B_SP) (110S). Here, the first electrode 120 is connected to the thin-film transistor TFT.

A roughness-inducing layer 115 is formed in the region of each of the subpixels SP (R_SP, G_SP and B_SP), except for the region in which an emission part EM is formed (120S). For example, the roughness-inducing layer 115 may be a silicon oxide film.

Subsequently, a bank 150 defining the emission part EM is provided in each of the subpixels SP (R_SP, G_SP and B_SP) so as to cover the roughness-inducing layer 115 (130S). Here, the bank 150 has an upper surface, which has a larger degree of surface roughness than the upper surface of the first electrode 120. It is presumed that the change in the roughness of the upper surface of the bank 150 is caused by surface repulsive force between the bank 150 and the roughness-inducing layer 115, rather than by the physical properties of the bank 150.

Subsequently, first common layers 131 and 132 are formed over all of the subpixels SP (R_SP, G_SP and B_SP) so as to cover the first electrode 120 and the bank.

Subsequently, light-emitting layers 133a and 133b are formed on the first common layer 132 in the emission part EM of each of the subpixels.

Subsequently, a second common layer 134 is formed over all of the subpixels SP (R_SP, G_SP and B_SP). The first common layers 131 and 132, the light-emitting layers 133a and 133b and the second common layer 134 constitute an organic stack 130 (refer to FIG. 3). Unlike the configuration illustrated in FIG. 3, the formation of the organic stack (140S) may be performed such that a hole transport auxiliary layer and an electron-blocking layer are additionally provided in a specific subpixel, as illustrated in FIG. 5, or may be performed such that a plurality of stacks is provided in common in the subpixels in a tandem type without being patterned, as illustrated in FIG. 6.

Subsequently, a second electrode 140 is formed on the second common layer 134 (150S).

Subsequently, as illustrated in FIG. 3, a capping layer 160 may be additionally formed on the second electrode 140, thereby completing the manufacture of the light-emitting display device.

In some cases, an encapsulation layer or an opposite substrate may be additionally provided on the capping layer 160.

The method may further include a step of providing a roughness-inducing layer in the region between adjacent first electrodes between the step of providing the first electrode and the step of providing the bank.

The method may further include a step of performing plasma treatment on the upper surface of the bank after the step of providing the bank.

Figure 12:
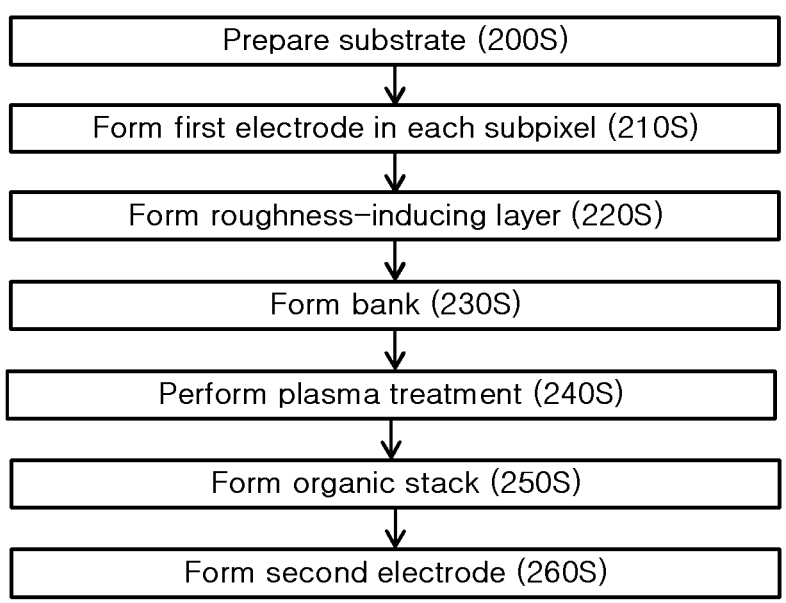
FIG. 12 is a process flow chart showing a method of manufacturing the light-emitting display device according to the second aspect of the present disclosure.

FIG. 12 is a process flow chart showing the method of manufacturing the light-emitting display device according to the second aspect of the present disclosure.

As illustrated in FIGS. 3 and 12, the method of manufacturing the light-emitting display device according to the second aspect of the present disclosure includes the following processes.

A substrate 100 having a plurality of subpixels SP (R_SP, G_SP and B_SP) is prepared (200S). Here, a thin-film transistor TFT is included in each subpixel SP of the substrate 100, as illustrated in FIG. 3.

Subsequently, a first electrode 120 is provided in each of the subpixels SP (R_SP, G_SP and B_SP) (210S). Here, the first electrode 120 is connected to the thin-film transistor TFT.

A roughness-inducing layer 115 is formed in the region of each of the subpixels SP (R_SP, G_SP and B_SP), except for the region in which an emission part EM is formed (220S). For example, the roughness-inducing layer 115 may be a silicon oxide film.

Subsequently, a bank 150 defining the emission part EM is provided in each of the subpixels SP (R_SP, G_SP and B_SP) so as to cover the roughness-inducing layer 115 (230S). Here, the bank 150 has an upper surface, which has a larger degree of surface roughness than the upper surface of the first electrode 120. It is presumed that the change in the roughness of the upper surface of the bank 150 is caused by surface repulsive force between the bank 150 and the roughness-inducing layer 115, rather than by the physical properties of the bank 150.

In addition, in the method of manufacturing the light-emitting display device according to the second aspect of the present disclosure, plasma treatment is performed after forming the bank 150 (240S). At this time, the plasma treatment may be performed using a mask while opening only the bank, or may be performed on the entire surface without a mask. Here, the surface roughness of the bank 250 (refer to FIG. 8B) and the surface roughness factor Rq thereof may be increased by using plasma reaction gas, which does not include oxygen, using only nitrogen gas as the plasma reaction gas. In this case, even when the plasma treatment is performed without a mask, the change of the surface roughness factor Rq of the first electrode 120 is slight, and thus the difference in the surface roughness factor Rq between the upper surface of the first electrode 120 and the upper surface of the bank 250 becomes 1.6 or more. As a result, when a specific subpixel is driven, the flow of leaked current in the horizontal direction above the bank 150 is greatly reduced, and thus it is possible to obtain the effects shown in FIG. 9.

Subsequently, first common layers 131 and 132 are formed over all of the subpixels SP (R_SP, G_SP and B_SP) so as to cover the first electrode 120 and the bank.

Subsequently, light-emitting layers 133a and 133b are formed on the first common layer 132 in the emission part EM of each of the subpixels.

Subsequently, a second common layer 134 is formed over all of the subpixels SP (R_SP, G_SP and B_SP). The first common layers 131 and 132, the light-emitting layers 133a and 133b and the second common layer 134 constitute an organic stack 130 (refer to FIG. 3). Unlike the configuration illustrated in FIG. 3, the formation of the organic stack (250S) may be performed such that a hole transport auxiliary layer and an electron-blocking layer are additionally provided in a specific subpixel, as illustrated in FIG. 5, or may be performed such that a plurality of stacks is provided in common in the subpixels in a tandem type without being patterned, as illustrated in FIG. 6.

Subsequently, a second electrode 140 is formed on the second common layer 134 (260S).

In the method of manufacturing the light-emitting display device according to the present disclosure, the difference between the first aspect and the second aspect is plasma surface treatment that is performed after the formation of the bank. Depending on the aspect, it is possible to increase the roughness of the upper surface of the bank by performing the plasma surface treatment (240S) (refer to FIG. 12) without providing a roughness-inducing layer.

As is apparent from the above description, in the aspects of the present disclosure, in order form convex and concave portions in the upper surface of the bank, a roughness-inducing layer is provided under the bank, or surface treatment is performed on the upper surface of the bank.

A light-emitting display device according to another embodiment may comprises a plurality of subpixels disposed on a substrate, a first electrode at each subpixel, a bank overlying an edge of the first electrode, a roughness-inducing layer under the bank between the first electrode of one of the subpixels and the first electrode of an adjacent subpixel, an emission part of the subpixels defined by the bank, a light-emitting layer corresponding to the emission part of the subpixels and a second electrode on the light-emitting layer over the plurality of subpixels.

Also, the roughness-inducing layer may include a silicon oxide film.

The light-emitting display device may further comprises a silicon nitride film disposed under the roughness-inducing layer and the first electrode.

The roughness-inducing layer may have an upper surface that has a larger degree of surface roughness than an upper surface of the first electrode.

The roughness-inducing layer may induce a surface roughness of an upper surface of the bank.

The light-emitting display device may further comprises a first common layer disposed over the subpixels and covering the first electrode and the bank and a second common layer disposed over the subpixels between the light emitting layer and the second electrode.

The light-emitting layer may extend to be disposed on the bank.

An area in which each of the first common layer and the second common layer may overlap the substrate is larger than an area in which the light-emitting layer overlaps the substrate.

The roughness-inducing layer may have a thickness of 1000 Å or more, and has the thickness less than a thickness of the bank.

The upper surface of the bank may be not flat.

With this configuration, the light-emitting display device and the method of manufacturing the same according to the present disclosure have the following effects.

First, the roughness of the upper surface of the bank is increased in order to lengthen the route along which current flows horizontally through common layers disposed above the bank, thereby increasing resistance and thus preventing current leakage in the horizontal direction. As a result, when a specific subpixel is driven, it is possible to prevent neighboring subpixels from emitting light due to current leakage.

Second, in order to cause the change in the roughness of the upper surface of the bank, a roughness-inducing layer may be provided under the bank, or plasma treatment may be directly applied to the upper surface of the bank. Alternatively, these two methods may be used at the same time in order to maximize the change in the roughness of the upper surface of the bank. As a result, the resistance of the upper surface of the bank is greatly increased, thereby preventing the flow of leaked current in the horizontal direction between adjacent subpixels.

It will be apparent to those skilled in the art that various modifications and variations can be made in the present disclosure without departing from the spirit or scope of the disclosure. Thus, it is intended that the present disclosure covers the modifications and variations of this disclosure provided they come within the scope of the appended claims and their equivalents.

What is claimed is:

1. A light-emitting display device comprising:
    a substrate having a plurality of subpixels;
    a first electrode provided in each of the subpixels;
    a bank defining an emission part in each of the subpixels and having an upper surface that has a larger degree of surface roughness than an upper surface of the first electrode;
    a first common layer over the subpixels and covering the first electrode and the bank;
    a light-emitting layer on the first common layer and corresponding to the emission part of each of the subpixels;
    a second common layer and a second electrode stacked on the light-emitting layer over the plurality of subpixels; and
    a roughness-inducing layer between the first electrode of one of the subpixels and the first electrode of an adjacent subpixel and under the bank.

2. The light-emitting display device according to claim 1, wherein the surface roughness of the bank is determined by a surface roughness of the roughness-inducing layer.

3. The light-emitting display device according to claim 1, wherein the upper surface of the bank is treated by plasma.

4. The light-emitting display device according to claim 1, wherein the roughness-inducing layer is a silicon oxide film.

5. The light-emitting display device according to claim 1, further comprising a silicon nitride film under the roughness-inducing layer and the first electrode.

6. The light-emitting display device according to claim 1, wherein the light-emitting layer extends to be disposed on the bank.

7. The light-emitting display device according to claim 1, wherein the first common layer includes at least one of a hole injection layer, a hole transport layer, and an electron-blocking layer, and wherein the second common layer includes at least one of a hole-blocking layer, an electron transport layer, and an electron injection layer.

8. The light-emitting display device according to claim 1, wherein an area in which each of the first common layer and the second common layer overlaps the substrate is larger than an area in which the light-emitting layer overlaps the substrate.

9. The light-emitting display device according to claim 1, wherein the roughness-inducing layer has a thickness of 1000 Å or more, and has the thickness less than a thickness of the bank.

10. A method of manufacturing a light-emitting display device, the method comprising:
    forming a plurality of subpixels on a substrate;
    forming a first electrode in each of the subpixels;
    forming a bank to define an emission part in each of the subpixels, wherein the bank has an upper surface that has a larger degree of surface roughness than an upper surface of the first electrode;
    forming a first common layer over the subpixels to cover the first electrode and the bank;
    forming a light-emitting layer on the first common layer to correspond to the emission part of each of the subpixels;
    forming a second common layer on the light-emitting layer over the subpixels;
    forming a second electrode on the second common layer; and
    forming a roughness-inducing layer between the first electrode of one of the subpixels and the first electrode of an adjacent subpixel, between the forming the first electrode and the forming the bank.

11. The method according to claim 10, further comprising performing plasma treatment on the upper surface of the bank after the forming the bank.

12. A light-emitting display device comprising:
    a plurality of subpixels disposed on a substrate;
    a first electrode at each subpixel;
    a bank overlying an edge of the first electrode;
    a roughness-inducing layer under the bank between the first electrode of one of the subpixels and the first electrode of an adjacent subpixel;
    an emission part of the subpixels defined by the bank;
    a light-emitting layer corresponding to the emission part of the subpixels; and
    a second electrode on the light-emitting layer over the plurality of subpixels,
    wherein the roughness-inducing layer has an upper surface that has a larger degree of surface roughness than an upper surface of the first electrode.

13. The light-emitting display device according to claim 12, wherein the roughness-inducing layer includes a silicon oxide film.

14. The light-emitting display device according to claim 12, further comprising a silicon nitride film disposed under the roughness-inducing layer and the first electrode.

15. The light-emitting display device according to claim 12, wherein the roughness-inducing layer induces a surface roughness of an upper surface of the bank.

16. The light-emitting display device according to claim 12, further comprising:
    a first common layer disposed over the subpixels and covering the first electrode and the bank; and
    a second common layer disposed over the subpixels between the light emitting layer and the second electrode.

17. The light-emitting display device according to claim 16, wherein an area in which each of the first common layer and the second common layer overlaps the substrate is larger than an area in which the light-emitting layer overlaps the substrate.

18. The light-emitting display device according to claim 12, wherein the light-emitting layer extends to be disposed on the bank.

19. The light-emitting display device according to claim 12, wherein the roughness-inducing layer has a thickness of 1000 Å or more, and has the thickness less than a thickness of the bank.

20. The light-emitting display device according to claim 12, wherein the upper surface of the bank is not flat.

* * * * *